United States Patent [19]
Miyauchi

[11] Patent Number: 6,167,483
[45] Date of Patent: Dec. 26, 2000

[54] BLOCK ERASE TYPE NONVOLATILE SEMICONDUCTOR MEMORY DEVICE

[75] Inventor: Shigenori Miyauchi, Hyogo, Japan

[73] Assignee: Mitsubishi Denki Kabushiki Kaisha, Tokyo, Japan

[21] Appl. No.: 09/372,589

[22] Filed: Aug. 12, 1999

[30] Foreign Application Priority Data

Apr. 1, 1999 [JP] Japan .................................. 11-094738

[51] Int. Cl.$^7$ .................................................. G06F 12/02
[52] U.S. Cl. ...................... 711/103; 711/165; 365/185.33
[58] Field of Search .................................... 711/103, 153, 711/165, 202, 173; 365/185.33

[56] References Cited

U.S. PATENT DOCUMENTS 5,388,083  2/1995  Assar et al. .............................. 365/218
6,081,447  6/2000  Lofgren et al. ....................... 365/185.02

*Primary Examiner*—Hiep T. Nguyen
*Attorney, Agent, or Firm*—McDermott, Will & Emery

[57] ABSTRACT

When the number of times erasure is performed in a first erase block in which data is to be written exceeds a predetermined number of times, a second erase block is determined for replacing data in the first erase block with data in the second erase block, and the erase number (the number of times erasure is performed) stored in the second erase block is read into a buffer. If the erase number read into the buffer is less than a certain value, data stored in the second erase block is read into the buffer. The number of the second erase block is stored in a first offset of a sub address conversion table read into a work buffer, and the number of the first erase block is stored in a second offset to replace data in the first and second erase blocks with each other.

7 Claims, 6 Drawing Sheets

FIG. 2

| | 21 | 22 | 23 |
|---|---|---|---|
| BK(M) | DATA STORAGE REGION M | ERASE NUMBER STORAGE REGION M | ECC STORAGE REGION M |
| | ⋮ | ⋮ | ⋮ |
| BK(3) | DATA STORAGE REGION 3 | ERASE NUMBER STORAGE REGION 3 | ECC STORAGE REGION 3 |
| BK(2) | DATA STORAGE REGION 2 | ERASE NUMBER STORAGE REGION 2 | ECC STORAGE REGION 2 |

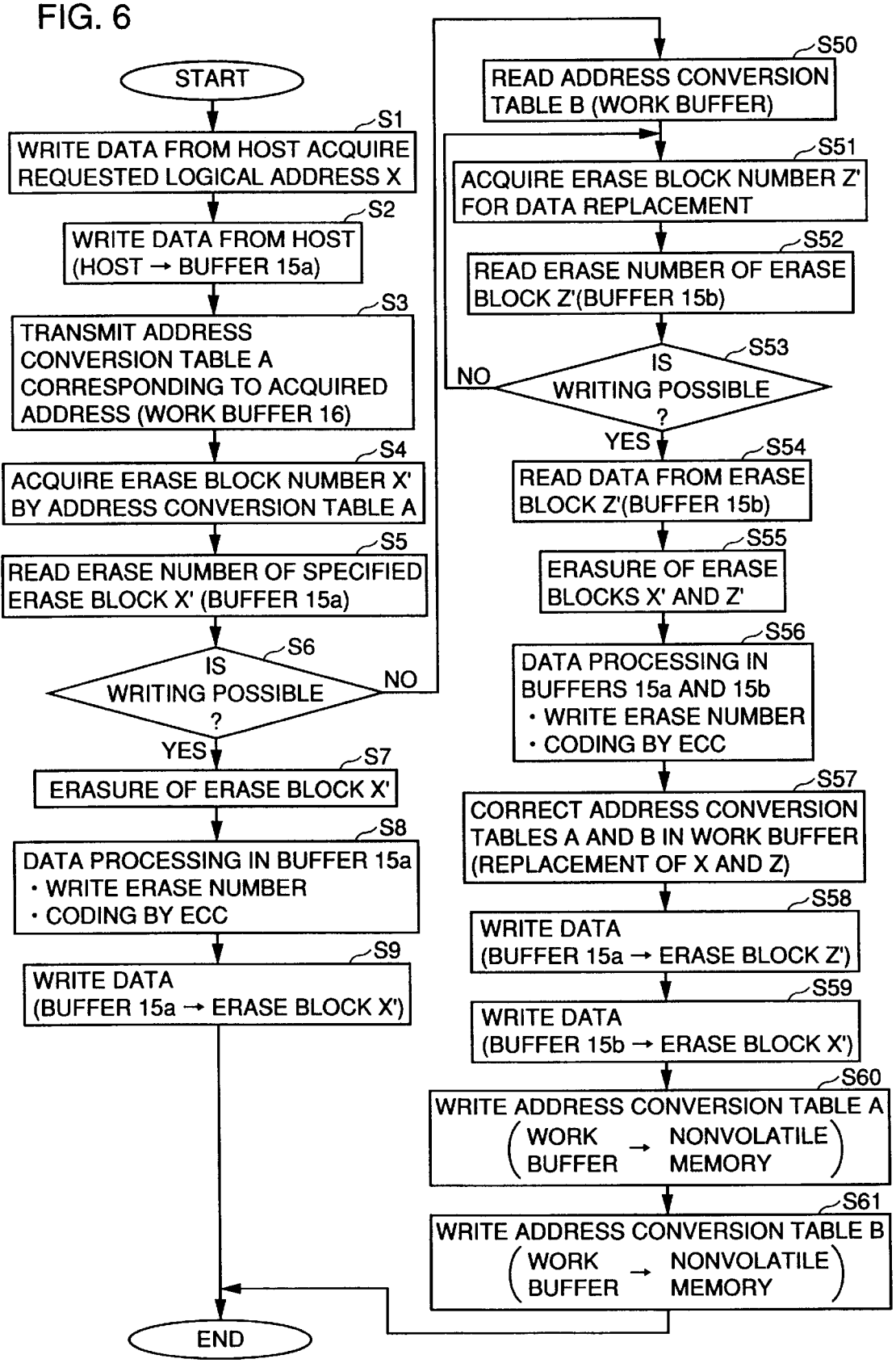

BLOCK ERASE TYPE NONVOLATILE SEMICONDUCTOR MEMORY DEVICE

BACKGROUND OF THE INVENTION

1. Field of the Invention

The present invention relates to a nonvolatile semiconductor memory device, and particularly to a nonvolatile semiconductor memory device using a block erase type nonvolatile memory.

2. Description of the Background Art

A nonvolatile semiconductor memory device using a block erase type nonvolatile memory such as the flash memory having a finite number of erase operations is characterized by the fact that it withstands a greater physical shock and consumes less power compared with a magnetic memory device such as the hard disk drive. However, such a nonvolatile semiconductor memory device has a high cost per bit and the number of times data is rewritten therein is limited to a maximum of several hundreds of thousands. The nonvolatile semiconductor memory device utilizing the block erase type nonvolatile memory is thus employed as a memory device for a portable computer that can easily be carried or as a film for an digital camera.

Most of host systems in such portable computers and digital cameras use a file system of FAT (File Allocation Table) type for keeping and managing data with a high compatibility. According to the FAT type file system, the internal portion of the memory device is divided into sections of a certain size, for example, sectors or clusters consisting of several sectors (each of the sections is hereinafter referred to as "erase block"), and numbers are given respectively to the blocks to be managed. The numbers are collected in a table referred to as FAT and stored in a specific region within the memory device. FAT is always referred to each time data is read/written, and if any change is made to the data, FAT is also changed. FAT is concentratively managed in the specific region of the memory device. Therefore, considering the entire semiconductor memory device, erase and write operations are more frequently done in an erase block utilized for keeping FAT, compared with an erase block which stores general purpose data such as an application. If the memory device continues its operation in this state, the number of times erasure is done exceeds the upper limit only in the erase block which manages FAT. Any scheme is thus required for solving this problem.

An approach to solve this problem is to replace data in an erase block where rewrite is frequently performed with data in an erase block where rewrite is rarely performed, each time erasure has been done a certain number of times that does not exceed the upper limit (the number of times the erase operation is performed is hereinafter referred to as "erase number"). According to a scheme disclosed in U.S. Pat. No. 5,388,083, the erase number of an erase block is stored and when the erase number of any erase block exceeds a predetermined number, data in that erase block is replaced with data in another erase block having the minimum erase number at this time. Accordingly, this procedure is repeated until all erase blocks have the same erase number. This scheme enables the erase number to be leveled and thus all erase blocks can be erased evenly.

In such a leveling scheme, (1) it is required to recognize among all of the erase blocks an erase block having the minimum erase number, and (2) the leveling process would be continued until the erasure is done the same number of times in all erase blocks even if the difference in erase number is a few. The feature (1) leads to complexity of the processing in the semiconductor memory device and the feature (2) could lead to decrease in lifetime of the semiconductor memory device.

SUMMARY OF THE INVENTION

An object of the present invention is to provide a nonvolatile semiconductor memory device which can easily level the difference between erase blocks in the number of times erasure is performed.

A nonvolatile semiconductor memory device according to an aspect of the invention includes a plurality of erase blocks, an address conversion table storage region, first selection means, second selection means, and replacement means. The plurality of erase blocks each have a data storage region and an erase number storage region. The address conversion table storage region stores an address conversion table which correlates a plurality of logical addresses to the plurality of erase blocks. The first selection means refers to the address conversion table to select from the plurality of erase blocks a first erase block which is correlated to a logical address externally supplied at the time of data writing. When the erase number (the number of times erasure is performed) stored in the first erase block exceeds a predetermined erase number, the second selection means refers to the address conversion table to select a second erase block from the plurality of erase blocks. When the erase number stored in the second erase block does not exceed the predetermined erase number, the replacement means writes data stored in the second erase block into the first erase block and writes externally supplied write data into the second erase block, and correlates the first erase block to a logical address to which the second erase block is correlated and correlates the second erase block to the logical address to which the first erase block is correlated.

The above nonvolatile semiconductor memory device is just required to determine the erase number stored in the second erase block and not required to determine the erase number of all of the plurality of erase blocks. The difference between erase blocks in terms of erase number can thus be leveled easily without any complicated process.

A nonvolatile semiconductor memory device according to another aspect of the invention includes a plurality of erase blocks, an address conversion table storage region, first selection means, second selection means, and replacement means. The plurality of erase blocks each have a data storage region and an erase number storage region. The address conversion table storage region stores an address conversion table which correlates a plurality of logical addresses to the plurality of erase blocks. The first selection means refers to the address conversion table to select from the plurality of erase blocks a first erase block which is correlated to a logical address externally supplied at the time of data reading. When the erase number stored in the first erase block exceeds a predetermined erase number, the second selection means refers to the address conversion table to select a second erase block from the plurality of erase blocks. When the erase number stored in the second erase block does not exceed the predetermined erase number, the replacement means replaces data stored in the first erase block with data stored in the second erase block, and correlates the first erase block to a logical address to which the second erase block is correlated and correlates the second erase block to the logical address to which the first erase block is correlated.

The above nonvolatile semiconductor memory device can thus level the difference in terms of erase number between erase blocks easily at the time of data reading.

A nonvolatile semiconductor memory device according to still another aspect of the invention includes a plurality of erase blocks, an address conversion table storage region, first selection means, second selection means, and replacement means. The plurality of erase blocks each have a data storage region and an erase number storage region. The address conversion table storage region stores an address conversion table which correlates a plurality of logical addresses to the plurality of erase blocks. The address conversion table is divided into a plurality of sub address conversion tables. The first selection means selects from the plurality of erase blocks a first erase block which is correlated to a logical address externally supplied at the time of data writing and selects a first sub address conversion table including the first erase block. When the erase number stored in the first erase block exceeds a predetermined erase number, the second selection means selects a second sub address conversion table and refers to the second sub address conversion table to select a second erase block. When the erase number stored in the second erase block does not exceed the predetermined erase number, the replacement means writes data stored in the second erase block into the first erase block and writes externally supplied write data into the second erase block, and correlates the first erase block to a logical address to which the second erase block is correlated and correlates the second erase block to the logical address to which the first erase block is correlated.

In the above nonvolatile semiconductor memory device having the second selection means and the replacement means can carry out the leveling operation even if the erase number of all erase blocks managed by the first sub address conversion table is close to the upper limit of the erase number of the nonvolatile memory.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates an internal structure of an erase block shown in FIG. 1.

FIG. 6 shows a flow chart illustrating a procedure of leveling the erase number at the time of data writing in the third embodiment.

DESCRIPTION OF THE PREFERRED EMBODIMENTS

Figure 1:
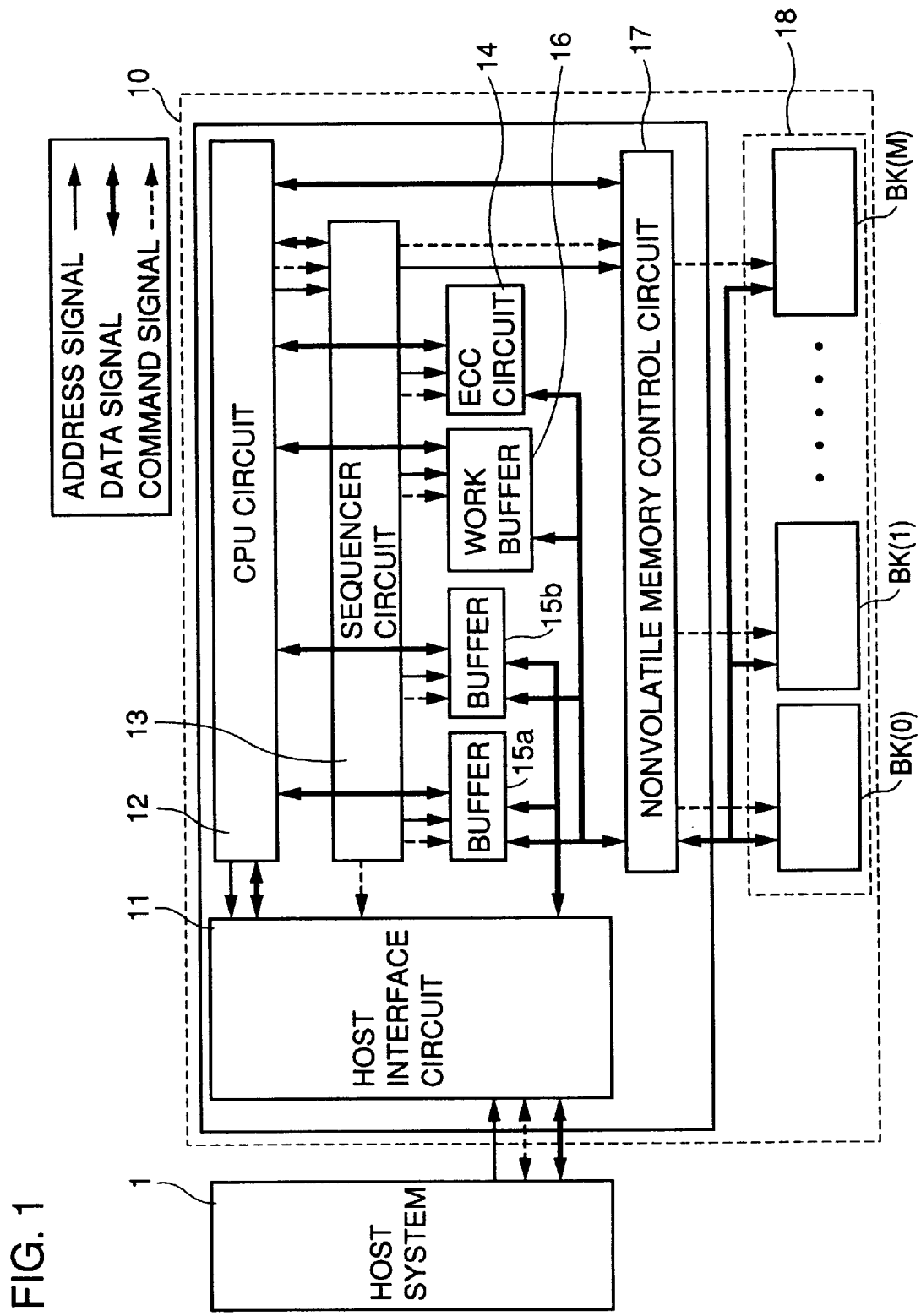
FIG. 1 is a block diagram illustrating an entire structure of a semiconductor memory device in the first embodiment of the invention.

Embodiments of the present invention are hereinafter discussed in detail with reference to the drawings. Like or equivalent components have the same reference characters in the drawings, and description thereof is not repeated here.

First Embodiment

FIG. 1 is a block diagram illustrating an entire structure of a semiconductor memory device in the first embodiment of the invention. Referring to FIG. 1, a semiconductor memory device 10 includes a host interface circuit 11, a CPU circuit 12, a sequencer circuit 13, an ECC circuit 14, buffers 15a and 15b, a work buffer 16, a nonvolatile memory control circuit 17, and a nonvolatile memory 18.

Host interface circuit 11 passes and receives an address signal, a data signal and a command signal to and from a host system 1 outside semiconductor memory device 10. CPU circuit 12 controls semiconductor memory device 10. Sequencer circuit 13 manages transmission of data. ECC (Error Checking and Correcting) circuit 14 is provided for enhancing the reliability of data storage. Buffers 15a and 15b temporarily store data in transmitting data. Work buffer 16 is provided for reading an address conversion table described below. Nonvolatile memory control circuit 17 controls nonvolatile memory 18 together with sequencer circuit 13 in transmitting data. Nonvolatile memory 18 is a block erase type nonvolatile memory such as a flash memory. In the block erase type nonvolatile memory, a memory array is divided into a plurality of blocks for applying an erase pulse and verifying erasure for each block. The memory array is herein divided into (M+1) blocks BK (0)–BK (M) each referred to as an erase block. A part of erase blocks BK (0)–BK (M) is used as an address conversion table. The size of buffers 15a and 15b is the same as that of erase blocks BK (0)–BK (M).

FIG. 2 illustrates an internal structure of erase blocks BK (2)–BK (M). Referring to FIG. 2, erase blocks BK (2)–BK (M) each include a data storage region 21, an erase number storage region 22, and an ECC storage region 23. Data supplied from host system 1 is stored in data storage region 21. In erase number storage region 22, the number of times erasure has been done in an erase block Bki (i=2–M) is stored. Data added by ECC circuit 14 is stored in ECC storage region 23.

All operations for transmitting data in semiconductor memory device 10 shown in FIG. 1 are carried out by controlling sequencer circuit 13 and nonvolatile memory control circuit 17 by CPU circuit 12. Sequencer circuit 13 generates various internal waveforms necessary for transmitting data, and nonvolatile memory control circuit 17 generates a control signal for nonvolatile memory 18 based on an erase block number supplied from CPU circuit 12.

An operation for reading data from nonvolatile memory 18 is now briefly described.

First, host system 1 supplies information to host interface circuit 11. Based on the information, CPU circuit 12 controls sequencer circuit 13 and nonvolatile memory control circuit 17 for generating any waveform necessary for reading data. Accordingly, data is read from nonvolatile memory 18 into buffer 15a. Based on the waveform generated by sequencer circuit 13, the data is transmitted from buffer 15a to host system 1 through host interface circuit 11. When the data is transmitted from nonvolatile memory 18 to buffer 15a, the read data is simultaneously decoded by ECC circuit 14. When any error occurs in the data, error information is passed through sequencer circuit 13 to CPU circuit 12 to correct the data in buffer 15a. The error correction may be made by software using CPU circuit 12, or made by hardware provided in the semiconductor memory device and dedicated to the error correction.

An operation for writing data into nonvolatile memory 18 is next described briefly.

When data is written in nonvolatile memory 18, CPU circuit 12 controls sequencer circuit 13 for generating a waveform necessary for writing data based on information supplied to host interface circuit 11, similarly to reading of data. Accordingly, data is stored in buffer 15*a* through host interface circuit 11. CPU circuit 12 then controls sequencer circuit 13 to transmit data in buffer 15*a* to ECC circuit 14 for performing a coding process. The processed data in buffer 15*a* is written in an erase block in nonvolatile memory 18 based on the waveform generated by sequencer circuit 13 and nonvolatile memory control circuit 17.

When data is transmitted, a command signal for requesting transmission of data, an address signal such as CHS (Cylinder Head Sector) and LBA (Logical Block Address: logical address), and a data signal are supplied from host system 1 to the memory device. Such information is written in a register provided to host interface circuit 11 and CPU circuit 12 judges the contents thereof.

In the nonvolatile semiconductor memory device of the first embodiment, the address conversion table is stored in erase blocks BK (0) and BK (1). By the address conversion table, a logical address supplied from host system 1 when data is written/read is correlated to any of erase blocks BK (2)–BK (M) of nonvolatile memory 18.

Figure 3:
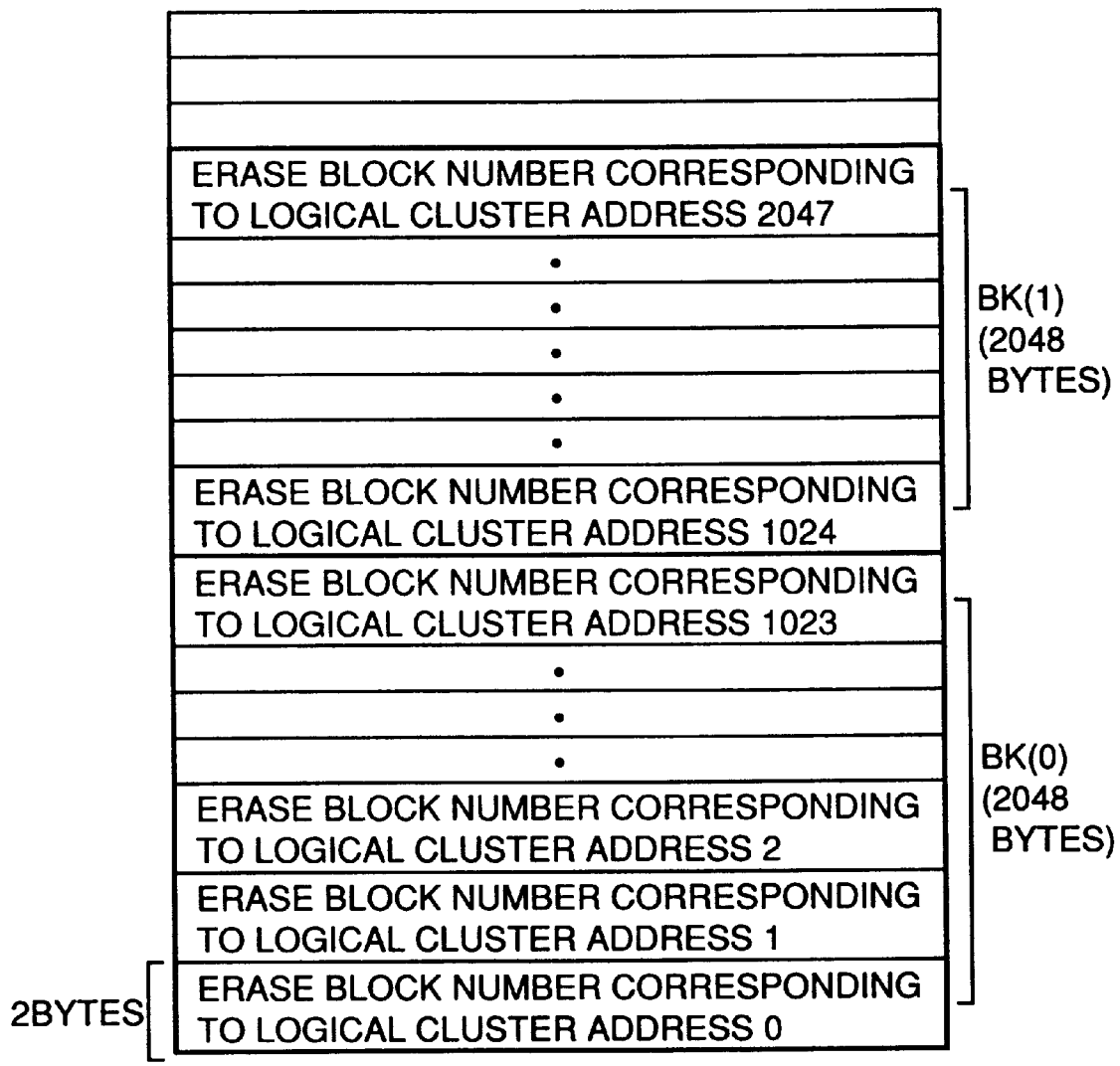
FIG. 3 illustrates an address conversion table.

FIG. 3 illustrates an address conversion table. Referring to FIG. 3, in the address conversion table, erase block numbers of the nonvolatile memory corresponding to logical addresses supplied from the host system are stored. The stored information may be any which allows the number of an erase block corresponding to a logical address supplied from host system 1 to be calculated.

In this embodiment, 512 bytes of data forms a unit corresponding to one sector to be read. A group of consecutive four sectors corresponds to one cluster and the storage capacity of an erase block is 2048 bytes. Further, 512 bytes of data as a unit is read into work buffer 16, the data length of an erase block number stored in the address conversion table is 2 bytes, and an erase block is each 2048 bytes. In other words, the address conversion table is divided into sub address conversion tables each having 512 bytes that is the unit of reading into work buffer 16. Four sub address conversion tables are stored in one erase block.

The size of the address conversion table changes depending on the stored information. The address conversion table is stored in nonvolatile memory 18. When data is transmitted, a corresponding sub address conversion table of 512 bytes is referred to.

As one example, a procedure followed when a logical sector address 5002 is supplied from host system 1 is discussed below.

(1) The logical sector address is converted to a logical cluster address (5002÷4=1250, residue 2).

The quotient 1250 is the logical cluster address and the residue 2 is an offset of a sector included in the cluster.

(2) Which erase block stores a corresponding sub address conversion table is determined (1250÷1024=1, residue 226). The quotient 1 is the number of an erase block in which the corresponding sub address conversion table is stored, and the residue 226 is an offset of the corresponding sub address conversion table in the erase block.

(3) The corresponding sub address conversion table in the erase block determined by the operation (2) above is calculated (226÷256=0, residue 226). The quotient 0 indicates that 512-byte data of 0–511 bytes in the erase block is the corresponding sub address conversion table, and the residue 226 indicates an offset in the table of 512-byte to be read. If the quotient is 1, 512-byte of 512–1023 bytes in the erase block is read referring to a corresponding sub address conversion table. The same procedure is followed if the quotient is 2 or 3.

A sub address conversion table read into the work buffer that corresponds to a logical address from host system 1 is thus specified.

Leveling of the erase number by the nonvolatile semiconductor memory device of the first embodiment is next described.

Figure 4:
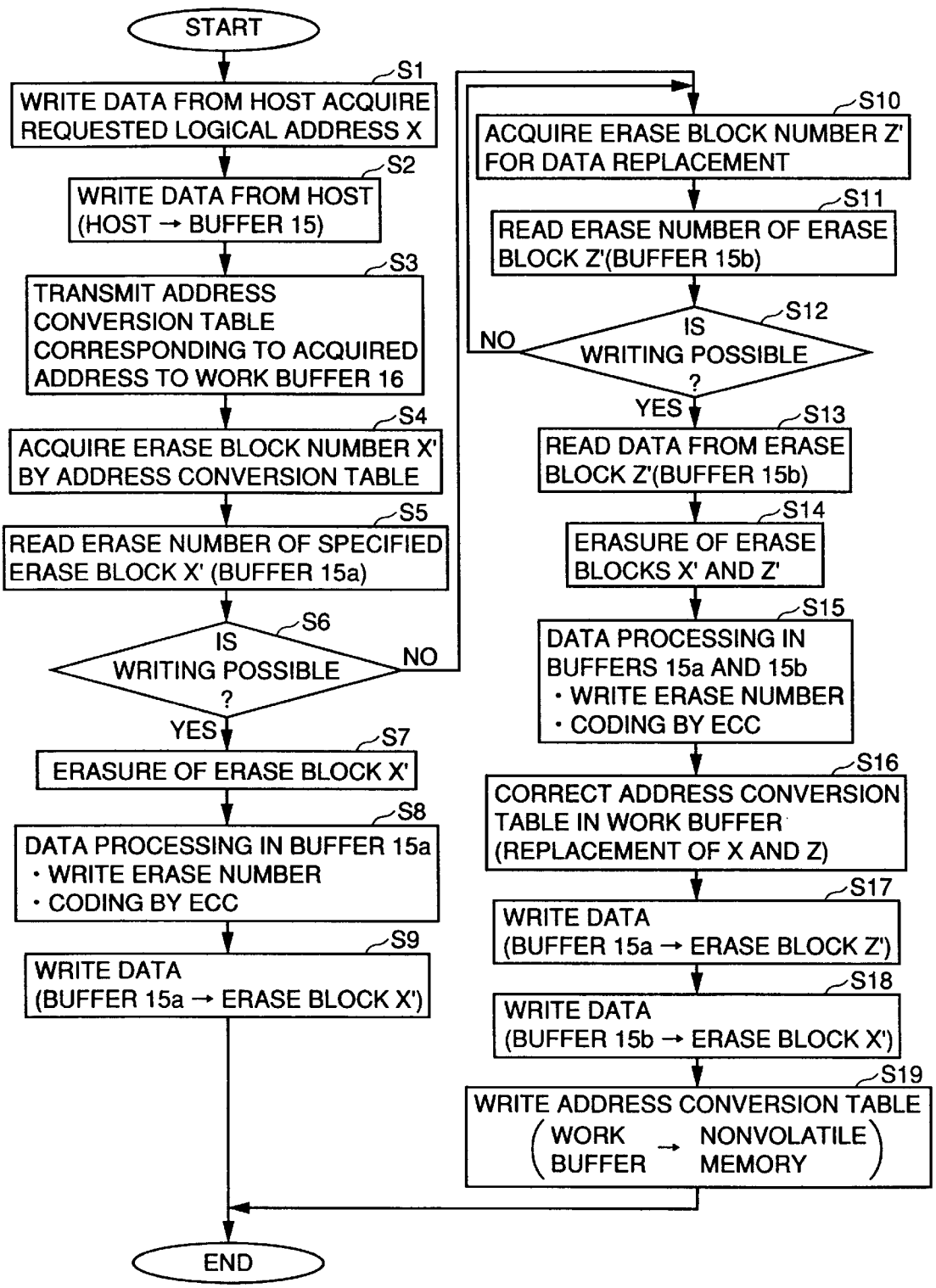
FIG. 4 shows a flow chart illustrating a procedure of leveling the erase number at the time of data writing in the first embodiment.

FIG. 4 shows a flow chart illustrating a procedure for leveling the erase number when data is written. Referring to FIG. 4, steps S1–S9 show a flow of an ordinary writing process, and steps S10–S19 show a flow of leveling the erase number.

In step S1, a write command and a logical address are supplied from host system 1. The write command and the logical address are written into a register prepared in host interface circuit 11.

In step S2, write data is supplied from host system 1 through host interface circuit 11.

In step S3, a sub address conversion table required for converting the logical address supplied in step 1 (referred to as X) to an erase block number of nonvolatile memory 18 (referred to as X') is read from nonvolatile memory 18 into work buffer 16.

In step S4, using the sub address conversion table read in step S3, erase block X' corresponding to logical address X is determined. The number of logical addresses stored in the read sub address conversion table is represented by Y (0 . . . Y-1), and erase block number X' corresponding to logical address X is stored in an offset x (0 . . . Y-1) in the sub address conversion table.

In step S5, the erase number (the number of times erasure is performed) of erase block X' is read from nonvolatile memory 18 into buffer 15*a*.

In step S6, whether or not the erase number is less than a certain value (the maximum erase number of nonvolatile memory 18, for example) is determined. If so, step S7 is carried out, and if not, step S10 is carried out.

If the erase number is less than the certain value, it is considered that the writing operation is possible and then step S9 is performed in which erase block X' is erased.

In step S7, 1 is added to the erase number obtained in step S5 and the resultant value is written in buffer 15*a,* and data in buffer 15*a* is coded using ECC circuit 14.

In step S8, data stored in buffer 15*a* is written in erase block X' of nonvolatile memory 18, and accordingly, the process is completed.

In step S6, if the erase number is not less than the certain value, the erase number is leveled. Specifically, if it is determined that the leveling operation is necessary based on the erase number read in step S5 (for example, if the erase number exceeds the maximum value when erasure and writing are performed a few times more), the leveling operation is carried out.

In step S10, an erase block Z' having data which is to be replaced is determined using offset x of the sub address conversion table in which the value of erase block X' is stored. An offset z in a sub address conversion table in which the value of erase block Z' is stored is calculated using f (x, y), for example, by z=f (x, Y)=(x+1)%Y. % represents calculation of residue.

In step S11, the erase number stored in erase block Z' is read into buffer 15*b*.

In step S12, whether or not the erase number read into buffer 15*b* is less than a certain value is determined. If so, step S13 is carried out, and if not, step S10 is carried out again and accordingly processes in steps S10 and S11 are repeated.

In step S13, data stored in erase block Z' is read into buffer 15b.

In step S14, erase blocks X' and Z' are erased.

In step S15, data in buffers 15a and 15b are processed. 1 is added to the erase number and the resultant value is written in buffers 15a and 15b. Using ECC circuit 14, data in buffers 15a and 15b are coded.

In step S16, the number of erase block Z' is stored in offset x of the sub address conversion table read into work buffer 16, and the number of erase block X' is stored in offset z for replacing data in erase blocks X' and Z' with each other.

In step S17, data stored in buffer 15a is written into erase block Z'.

In step S18, data stored in buffer 15b is written into erase block X'.

The sub address conversion table read into work buffer 16 is written in nonvolatile memory 18.

Leveling of the erase number is thus achieved.

Use of the sub address conversion table enables CPU circuit 12 to freely write data in a desired erase block in nonvolatile memory 18 regardless of the logical address number supplied from host system 1.

In general, prior to the data transmission operation, the address conversion table is sure to be read into work buffer 16. In an embodiment disclosed in U.S. Pat. No. 5,388,083, for example, information necessary for address conversion is distributed to be stored in all erase blocks, and data for address conversion in all the erase blocks are read onto a work buffer and then an address conversion table is configured. In this case, it takes a considerable time to configure the address conversion table. However, once the address conversion table is produced, the performance of address conversion in data transmission achieves the highest rate.

In the first embodiment, the address conversion table is concentratively managed and stored in the nonvolatile memory, and a sub address conversion table necessary for address conversion is read into work buffer 16 in data transmission. The size to be read is the minimum erase size of the erase block of nonvolatile memory 18. Accordingly, any work for producing an address conversion table by retrieving all the erase blocks is unnecessary. Further, the capacity of work buffer 16 can be decreased.

An overhead that the sub address conversion table is always transmitted from nonvolatile memory 18 to work buffer 16 each time the address is converted is added. However, this overhead can be performed during a period in which data is transmitted from host system 1 to buffers 15a and 15b in data writing. Regardless of data reading or writing, once the address conversion table is read into work buffer 16, re-reading is unnecessary during a period in which the read sub address conversion table corresponds to a logical address requested by host system 1. Then, the overhead can considerably be reduced. Only the minimum size for erasure is read in order to advantageously level the difference in erase number between erase blocks.

In step S10, offset z in the sub address conversion table in which erase block Z' is stored is calculated according to $z=f(x, Y)=(x+1)\%Y$. However, if FAT has a large size, a plurality of erase blocks of the nonvolatile memory are applied to the FAT. In this case, erase blocks adjacent to each other are highly possibly FATs. Therefore, if erase block Z' having the erase number which enables writing is retrieved utilizing $z=(x+1)\%Y$, it takes a considerable time to find out an erase block which can be replaced. The time required for retrieving can be reduced if $z=f(x, Y)=(x+Y/2-1)\%Y$ is employed, for example, that allows the block to be retrieved with a suitable offset, and accordingly, the disparity of the erase number of the erase blocks can be reduced to at least $z=(x+1)\%Y$.

Second Embodiment

Figure 5:
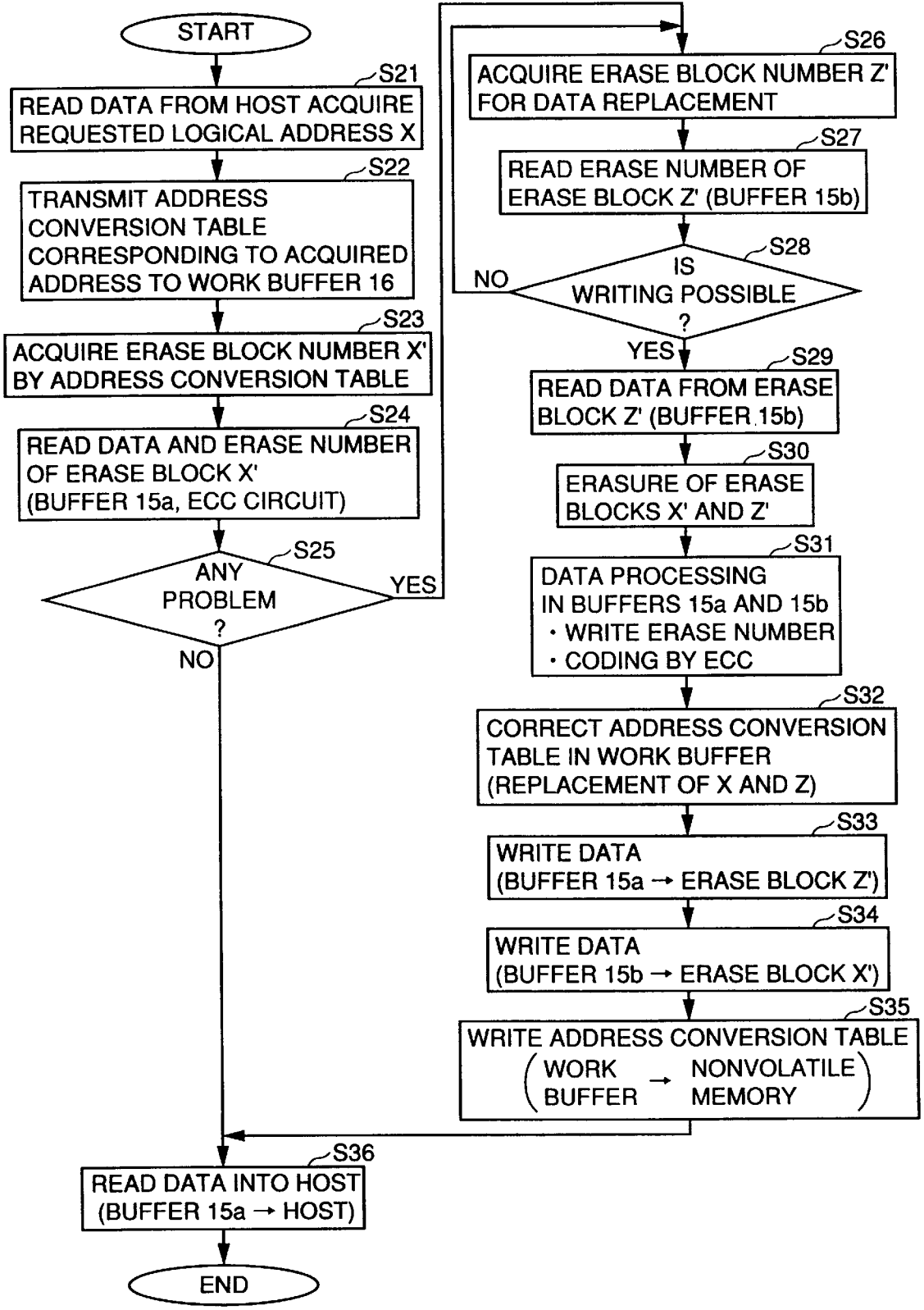
FIG. 5 shows a flow chart illustrating a procedure of leveling the erase number at the time of data reading in the second embodiment.

While the leveling process at the timing of data writing is discussed in the first embodiment, the leveling process is possible in data reading. FIG. 5 shows a flow chart illustrating a procedure of leveling the erase number in data reading. The procedure is described below with reference to FIG. 5.

In step S21, a data read command and a logical address are supplied from host system 1. The read command and the logical address are written in a register prepared in host interface circuit 11.

In step S22, a sub address conversion table required for converting the logical address X supplied in step S1 to an erase block number X' of nonvolatile memory 18 is read from nonvolatile memory 18 into work buffer 16.

In step S23, using the read sub address conversion table, erase block X' corresponding to the logical address X is determined. Similarly to the first embodiment, the number of logical addresses stored in the sub address conversion table and read at a time is represented by Y (0 ... Y-1), and the erase block number X' corresponding to the logical address X is stored in an offset x (0 ... Y-1) in the sub address conversion table.

In step S24, the erase number of erase block X' is read from the nonvolatile memory into buffer 15a.

In step S25, there is no problem if the erase number is less than a certain value (the maximum erase number of nonvolatile memory 18, for example), and then step S36 is carried out. In step S36, data in buffer 15a is transmitted to host system 1 and the process is completed.

In step S25, if the erase number is not less than the certain value, the leveling process according to steps S26–S35 is performed. The processes in steps S26–S35 are similar to those in steps S10–S19 shown in FIG. 4.

In the second embodiment, the leveling process is also possible in data reading as described above.

Although whether or not the leveling process is necessary is determined based on the erase number of the read erase block (step S25), a trigger therefore may be provided by finding a data error in ECC circuit 14 when data is read. In this case, the leveling operation is not so frequently done compared with the former case.

Third Embodiment

Although leveling of the erase number is possible in the first and second embodiments, the leveling operation is impossible if all of the erase blocks managed by a sub address conversion table read at a time each have the erase number which is close to the maximum erase number of the nonvolatile memory.

A purpose of the third embodiment is to avoid this problem.

A nonvolatile semiconductor memory device in the third embodiment further includes a second work buffer in addition to the components illustrated in FIG. 1. The second work buffer has the same capacity as that of work buffer 16.

FIG. 6 shows a flow chart illustrating a procedure of leveling the erase number when data is written in the third embodiment. Referring to FIG. 6, the procedure of leveling the erase number is described below.

In steps S1–S9, processes similar to those shown in FIG. 4 are carried out.

A main difference between the third embodiment and the first embodiment is that when it is determined that leveling is necessary in step S6, a sub address conversion table B irrelevant to writing of data from host system 1 is read into the second work buffer in step S50. Similarly to the method of specifying the erase block, sub address conversion table B may be selected according to B=(A+1)%C. C represents a quotient obtained by dividing all address conversion tables by reading size Y into work buffer 16.

In step S51, an erase block Z' having data to be replaced in sub address conversion table B is determined. The method of determining the erase block is similar to that in step S10 of FIG. 4.

In steps S51–S59, processes similar to those of steps S11–S18 of FIG. 4 are conducted.

Next in steps S60 and S61, sub address conversion tables A and B stored in work buffer 16 and the second work buffer are written in nonvolatile memory 18.

In the third embodiment, the leveling operation can be performed even if all the erase blocks managed by one sub address conversion table each have the erase number which is close to the maximum erase number of the nonvolatile memory.

By employing the leveling operation together with that of the first embodiment, leveling of the erase number can be used in a wider application.

Although the sub address conversion table B is selected based on B=(A+1)%C in step S50, B=(A+C/2−1)%C may be employed instead.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of erase blocks each having a data storage region and an erase number storage region;
   an address conversion table storage region for storing an address conversion table which correlates a plurality of logical addresses to said plurality of erase blocks;
   first selection means referring to said address conversion table for selecting from said plurality of erase blocks a first erase block correlated to a logical address which is externally supplied at the time of data writing;
   second selection means referring to said address conversion table for selecting a second erase block from said plurality of erase blocks when an erase number stored in said first erase block exceeds a predetermined erase number; and
   replacement means for writing data stored in said second erase block into said first erase block and writing externally supplied write data into said second erase block, and correlating said first erase block to a logical address to which said second erase block is correlated and correlating said second erase block to the logical address to which said first erase block is correlated when an erase number stored in said second erase block does not exceed said predetermined erase number.

2. The nonvolatile semiconductor memory device according to claim 1, wherein
   said address conversion table is divided into a plurality of sub address conversion tables,
   said first selection means further selects a sub address conversion table including said first erase block, and
   said second selection means refers to the sub address conversion table selected by said first selection means to select said second erase block when the erase number stored in said first erase block exceeds said predetermined erase number.

3. The nonvolatile semiconductor memory device according to claim 2, wherein
   an integral multiple of a storage capacity necessary for each of said sub address conversion tables is equal to a storage capacity of each of said plurality of erase blocks.

4. A nonvolatile semiconductor memory device comprising:
   a plurality of erase blocks each having a data storage region and an erase number storage region;
   an address conversion table storage region for storing an address conversion table which correlates a plurality of logical addresses to said plurality of erase blocks;
   first selection means referring to said address conversion table for selecting from said plurality of erase blocks a first erase block correlated to a logical address which is externally supplied at the time of data reading;
   second selection means referring to said address conversion table for selecting a second erase block from said plurality of erase blocks when an erase number stored in said first erase block exceeds a predetermined erase number; and
   replacement means for replacing data stored in said first erase block with data stored in said second erase block and correlating said first erase block to a logical address to which said second erase block is correlated and correlating said second erase block to the logical address to which said first erase block is correlated when an erase number stored in said second erase block does not exceed said predetermined erase number.

5. The nonvolatile semiconductor memory device according to claim 4, wherein
   said address conversion table is divided into a plurality of sub address conversion tables,
   said first selection means further selects a sub address conversion table including said first erase block, and
   said second selection means refers to the sub address conversion table selected by said first selection means to select said second erase block when the erase number stored in said first erase block exceeds said predetermined erase number.

6. The nonvolatile semiconductor memory device according to claim 5, wherein
   an integral multiple of a storage capacity necessary for each of said sub address conversion tables is equal to a storage capacity of each of said plurality of erase blocks.

7. A nonvolatile semiconductor memory device comprising:
   a plurality of erase blocks each having a data storage region and an erase number storage region;

an address conversion table storage region for storing an address conversion table which correlates a plurality of logical addresses to said plurality of erase blocks, said address conversion table divided into a plurality of sub address conversion tables;

first selection means for selecting from said plurality of erase blocks a first erase block correlated to a logical address which is externally supplied at the time of data writing and selecting a first sub address conversion table including the first erase block;

second selection means for selecting a second sub address conversion table and referring to the second sub address conversion table to select a second erase block when an erase number stored in said first erase block exceeds a predetermined erase number; and replacement means for writing data stored in said second erase block into said first erase block and writing externally supplied write data into said second erase block, and correlating said first erase block to a logical address to which said second erase block is correlated and correlating said second erase block to the logical address to which said first erase block is correlated when an erase number stored in said second erase block does not exceed said predetermined erase number.

* * * * *